(12) United States Patent
Adenau

(10) Patent No.: US 11,009,649 B2
(45) Date of Patent: May 18, 2021

(54) LIGHTING CONTROL CONSOLE HAVING A SLIDE CONTROL

(71) Applicant: MA LIGHTING TECHNOLOGY GMBH, Waldbüttelbrunn (DE)

(72) Inventor: Michael Adenau, Würzburg (DE)

(73) Assignee: MA LIGHTING TECHNOLOGY GMBH, Waldbüttelbrunn (DE)

(*) Notice: Subject to any disclaimer, the term of this patent is extended or adjusted under 35 U.S.C. 154(b) by 0 days.

(21) Appl. No.: 16/306,241

(22) PCT Filed: Oct. 23, 2017

(86) PCT No.: PCT/EP2017/076997
§ 371 (c)(1),
(2) Date: Nov. 30, 2018

(87) PCT Pub. No.: WO2019/080991
PCT Pub. Date: May 2, 2019

(65) Prior Publication Data
US 2020/0379161 A1    Dec. 3, 2020

(51) Int. Cl.
G05G 1/02      (2006.01)
F21V 8/00      (2006.01)
H03K 17/969    (2006.01)

(52) U.S. Cl.
CPC ........... G02B 6/0038 (2013.01); G02B 6/002 (2013.01); G05G 1/025 (2013.01); H03K 17/969 (2013.01)

(58) Field of Classification Search
CPC ...... H05B 47/155; H05B 47/10; H05B 47/18; H05B 45/20; G06F 3/04886; H04N 5/222;
(Continued)

(56) References Cited

U.S. PATENT DOCUMENTS 3,856,127 A * 12/1974 Halfon ................. H03K 17/969
                                                     400/479
7,236,154 B1 * 6/2007 Kerr ..................... G09G 3/3406
                                                     345/102
(Continued)

FOREIGN PATENT DOCUMENTS

CN    101846832 A    9/2010
DE    87 12 678 U1   1/1989
EP    0 935 091 A1   8/1999

OTHER PUBLICATIONS

China National Intellectual Property Administration, First Office Action and Search Report, Application No. 201780040171.9, dated Mar. 4, 2020, 12 pages.
(Continued)

Primary Examiner — Rajarshi Chakraborty
Assistant Examiner — Fatima N Farokhrooz
(74) Attorney, Agent, or Firm — Quarles & Brady LLP

(57) ABSTRACT

The invention relates to a lighting control console (01) for controlling a lighting system, digital adjusting commands being generated in the lighting control console (01), a slide control (06) being provided in the housing (08) of the lighting control console, a slit (09) being provided in the housing (08) of the lighting control console (01), being penetrated by a connecting lever originating from the interior of the housing (08) and mechanically connecting the control knob (07) to the slide control (06), at least one light conducting element (10) allocated to the slit (09) being provided in the housing (08) of the lighting control console (01) and extending along the longitudinal axis of the slit (09), at least one light source being provided in the housing (08) of the lighting control console (01) and said light conducting element (10) comprising at least one light entry surface (13) at which light can be coupled into the light conducting element (10) from the light source, said light
(Continued)

conducting element (10) comprising light exit surfaces along the longitudinal axis of the slit (09), light being able to exit from the light conducting element (10) at the light exit surfaces.

6 Claims, 4 Drawing Sheets

(58) Field of Classification Search
CPC .... G01D 5/02; H01H 19/14; H01H 2019/143; G02B 6/0038; G02B 6/002; G05G 1/025; Y02B 20/40

See application file for complete search history.

(56) References Cited

U.S. PATENT DOCUMENTS

| | | | |
|---|---|---|---|
| 7,784,968 B2 | 8/2010 | Huber | |
| 9,402,291 B1* | 7/2016 | Adenau | H05B 47/155 |
| 2007/0217211 A1 | 9/2007 | Hewson et al. | |
| 2009/0244883 A1 | 10/2009 | Natsume et al. | |
| 2011/0013411 A1* | 1/2011 | Sakiyama | F21S 43/251 |
| | | | 362/494 |
| 2012/0134176 A1* | 5/2012 | Chang | G02B 5/045 |
| | | | 362/606 |
| 2016/0234908 A1 | 8/2016 | Adenau | |

OTHER PUBLICATIONS

Search Report dated Jun. 11, 2018, 2018 in connection with PCT/EP2017/076697.

English Translation of the Written Opinion of the International Searching Authority dated Jun. 8, 2018 in connection with PCT/EP2017/076997.

* cited by examiner

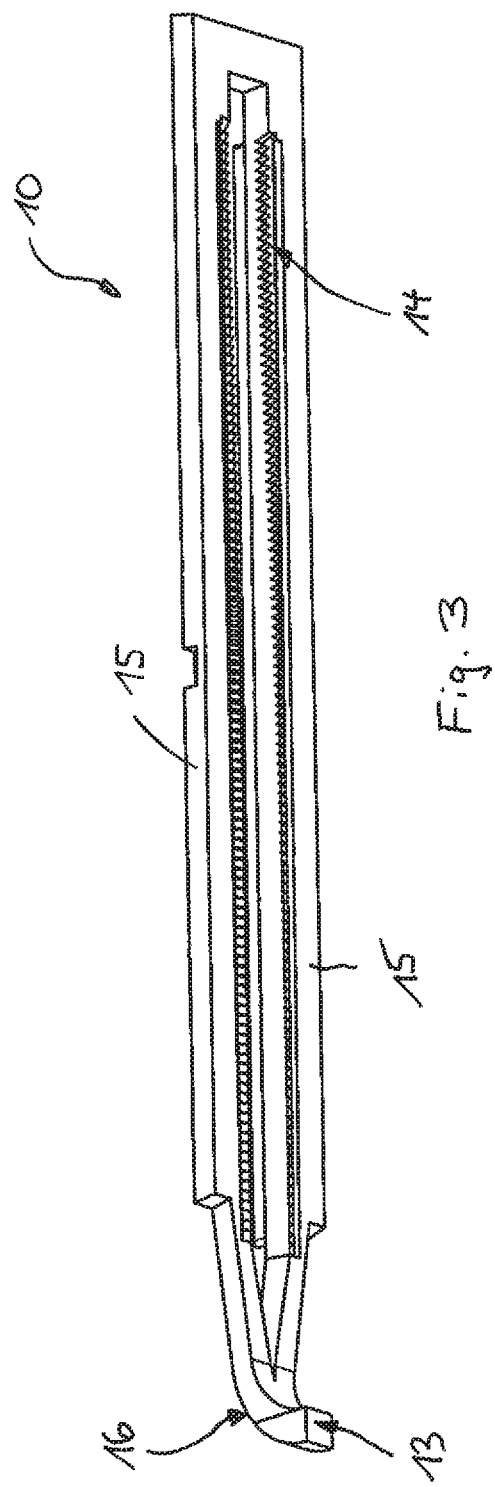

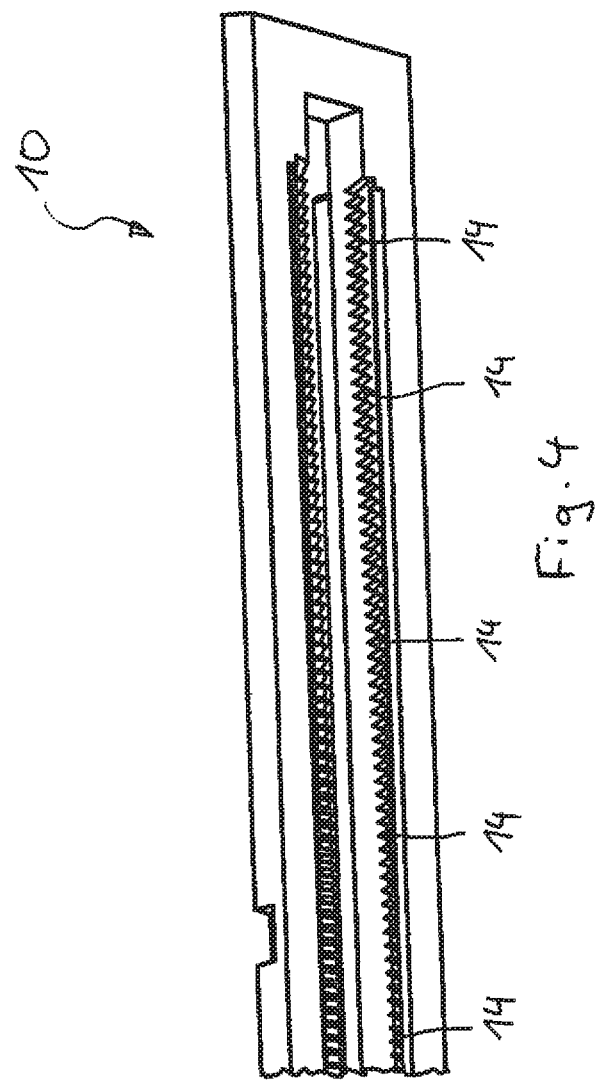

LIGHTING CONTROL CONSOLE HAVING A SLIDE CONTROL

CROSS-REFERENCE TO RELATED APPLICATIONS

This application represents the national stage entry of PCT International Application No. PCT/EP2017/076997 filed Oct. 23, 2017. The contents of this application are hereby incorporated by reference as if set forth in their entirety herein.

The invention relates to a lighting control console having a slide control according to the preamble of claim 1.

Generic lighting control consoles serve for controlling lighting systems such as they are used in theaters or for concert stages. These lighting systems generally comprise a plurality of lighting devices, such as stage lights, albeit these lighting devices can differ from each other in terms of a plurality of lighting conditions, such as different colors. These different lighting conditions are controlled via programmed parameters in the lighting program of the lighting control console. Common lighting systems can comprise up to several thousand lighting devices.

To be able to control such complex lighting systems, the generic lighting control consoles are equipped with a digital processor which allows digitally processing data and signals. In addition, a digital memory is provided for storing the data, which in particular allows archiving lighting programs.

In order to program the lighting program or for controlling the lighting program during a sequence, the user has to input control commands as input values. In this context, this can be the selection of a certain lighting device or the setting of a certain lighting parameter, such as luminosity. Mechanical control elements, such as pushbuttons, rotary knobs or slide controls, are provided for inputting these control commands at known lighting control consoles. The control commands allocated to the individual control elements can be altered via suitable menu switches in order to be able to program and control accordingly complex lighting programs.

The slide controls installed at the known lighting control consoles are characterized by the inputs being carried out by linearly adjusting a control knob. For this purpose, the control knob is disposed outside of the housing of the lighting control console and is connected to the slide control present in the interior of the housing by means of a connecting lever. The connecting lever extends through a slit in the housing of the lighting control console.

Lighting control consoles are often used in a setting which is to be kept dark, such as a theater or concert hall. Extraneous light for illuminating the control panel on the lighting control console is unwelcome in such darkened settings. In order to still enable the user to safely access different control elements, lighting control consoles are known which have different control elements illuminated from behind. Accordingly, slide controls are known in which the slit in the housing, through which the connecting lever extends in order to connect the control knob to the slide control, can be illuminated along its longitudinal axis. This has the advantage on the one hand of the user being able to see the position of the control knob and on the other hand of the control knob being able to be seen in relation to the slit length. Due to the linear extension of the slit, a considerable expenditure has thus far been required for illuminating the slit from behind by means of a light conducting element.

Therefore, the known light conducting elements have to be illuminated by several light sources, which are disposed in the interior of the housing, in order to illuminate the slit at the slide controls. For this purpose, the known light conducting elements comprise several light entry surfaces at which the individual light sources couple their light into the light conducting element so that this light illuminates the slit as evenly as possible at the light exit surfaces of the light conducting element.

The object of the present invention is to propose a lighting control console having illuminated slide controls which enable a largely even illumination of the slit in the housing while requiring a lesser constructional expenditure.

This object is attained by a lighting control console according to the teachings of claim 1.

Advantageous embodiments of the invention are the subject matter of the dependent claims.

The light conducting element on the lighting control console according to the invention is first characterized by said light conducting element having only one main light entry surface through which the entire light is coupled for illuminating the slit in the housing of the lighting control console. The light source for coupling the light into the light conducting element is to be positioned near the main light entry surface as is adequate. By using only one main light entry surface at which the entire light required for illuminating the slit is coupled using only one light source, the constructional expenditure is significantly reduced since several light sources having corresponding light entry surfaces at the light conducting element, as known from known lighting control consoles, can be omitted.

In order to ensure an even illumination of the longitudinally extending slit despite coupling the light into the light conducting element at only one individual main light entry surface, the light exit surfaces are formed by several light exit elements at the light conducting element according to the invention, said light exit elements being disposed one behind the other along the slit after mounting the light conducting element. According to the invention, it is intended that the size of the light exit elements and/or the distance between adjacent light exit elements correlate(s) with the distance to the main light entry surface. Therefore, in other words, this means that according to the first variation, the size of the light exit elements increases the farther the light exit element is distanced from the main light entry surface. Vice versa, light exit elements disposed close to the main light entry surface are accordingly smaller. Owing to this correlation between the size of the light exit elements and the distance to the main light entry surface, the amount of the light exiting at the individual light exit elements can be varied to such a degree that the luminosity decreasing with the increasing distance to the main light entry surface is compensated. In light exit surfaces disposed close to the main light entry surface, the luminosity is correspondingly high so that correspondingly small light exit elements suffice for ensuring sufficient illumination of the slit in this area. In contrast, in light exit elements disposed far from the main light entry surface the size of the light exit elements is correspondingly enlarged so as to ensure an even illumination of this area along the slit.

In the same manner, not just the size of the individual light exit elements but also the distance between adjacent light exit elements can be used for compensating the decreasing luminosity. Thus, light exit elements disposed close to the main light entry surface can have a relatively large distance whereas the distance of adjacent light exit elements is chosen to be correspondingly smaller at a large distance to the main light entry surface in order to ensure an overall even illumination of the slit along the longitudinal axis.

Which geometric shape the individual light exit elements have is generally arbitrary. According to a preferred embodiment, it is intended for light exit prisms to be available as light exit elements at the light conducting element.

In order to attain an even illumination of the slit, the size of the light exit elements can increase linearly as the distance to the main light entry surface increases. In this instance, it is advantageous for an even illumination of the slit if the light exit elements each have an equidistant distance.

Alternatively, the distance between adjacent light exit elements can linearly decrease as the distance to the main light entry surface increases while the light exit elements themselves each have the same size.

Owing to the linear variation of the distance between the adjacent light exit elements or owing to the linear variation of the size of the individual light exit elements, the essentially linear decrease in luminosity can be compensated highly evenly as the distance to the main light entry surface increases.

In order to alleviate orientation for the user when using the slide control in darkened spaces, it is particularly advantageous if both sides of the slit are illuminated along its longitudinal axis. In order to ensure this, it is intended according to a preferred embodiment for the light conducting element to diverge into two separate light branches starting from the main light entry surface with the slit extending between the two light branches. The two light branches then each evenly illuminate one side of the slit.

In order to facilitate fixing the light source, by means of which the light is coupled into the light conducting element, it is particularly advantageous if the light conducting element has an arch between the main light entry surface and the two light branches. This arch can be an orthogonal arch, for example, so that the light, which has been coupled at the main light entry surface, is deflected by 90° in this instance. In this manner, the light sources to be fixed at the main light entry surfaces can be fastened at a distance to the inner side of the housing without any problems.

For a particularly cost-efficient embodiment, the light conducting element can be made from a plastic material which conducts light. For illuminating the light conducting elements, LED lighting means are particularly suitable.

An embodiment of the invention is schematically illustrated in the drawings and is explained by means of examples in the following.

In the following,

FIG. 3 illustrates a light conducting element according to FIG. 2 in a perspective view from the bottom;

FIG. 4 illustrates the light conducting element according to FIG. 3 in an enlarged partial view.

Figure 1:
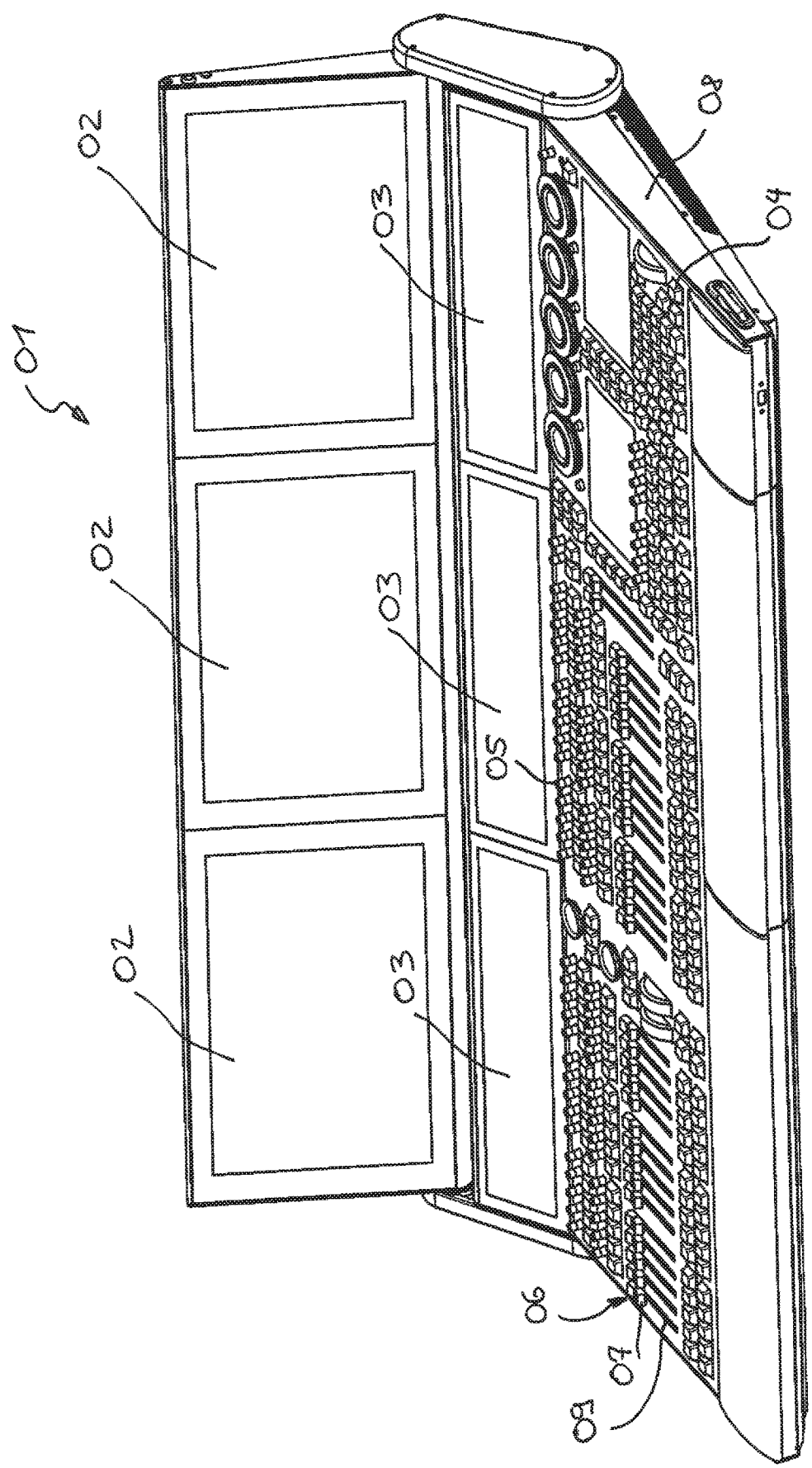
FIG. 1 illustrates a lighting control console having several slide controls in a perspective view from the front.

FIG. 1 illustrates in a perspective view a lighting control console 01 according to the invention for programming and controlling a stage lighting system. The lighting control console 01 is equipped with three monitors 02 and three monitors 03 for displaying various menus to the user. For inputting adjusting commands, a plurality of pushbuttons 04, rotary knobs 05 and slide controls 06 are provided at the lighting control console 01. Each slide control 06 is equipped with a control knob 07 connected to the slide control, which is disposed on the inner side of the housing 08, by means of a connecting lever not illustrated in FIG. 1.

The connecting lever between the control knob 07 and the actual slide control 06 extends through slits 09 in the housing 08. In the lighting control console 01 illustrated in FIG. 1, the slits 09 in the housing 08 are illuminated by means of light conducting elements 10 to be further described in the following.

Figure 2:
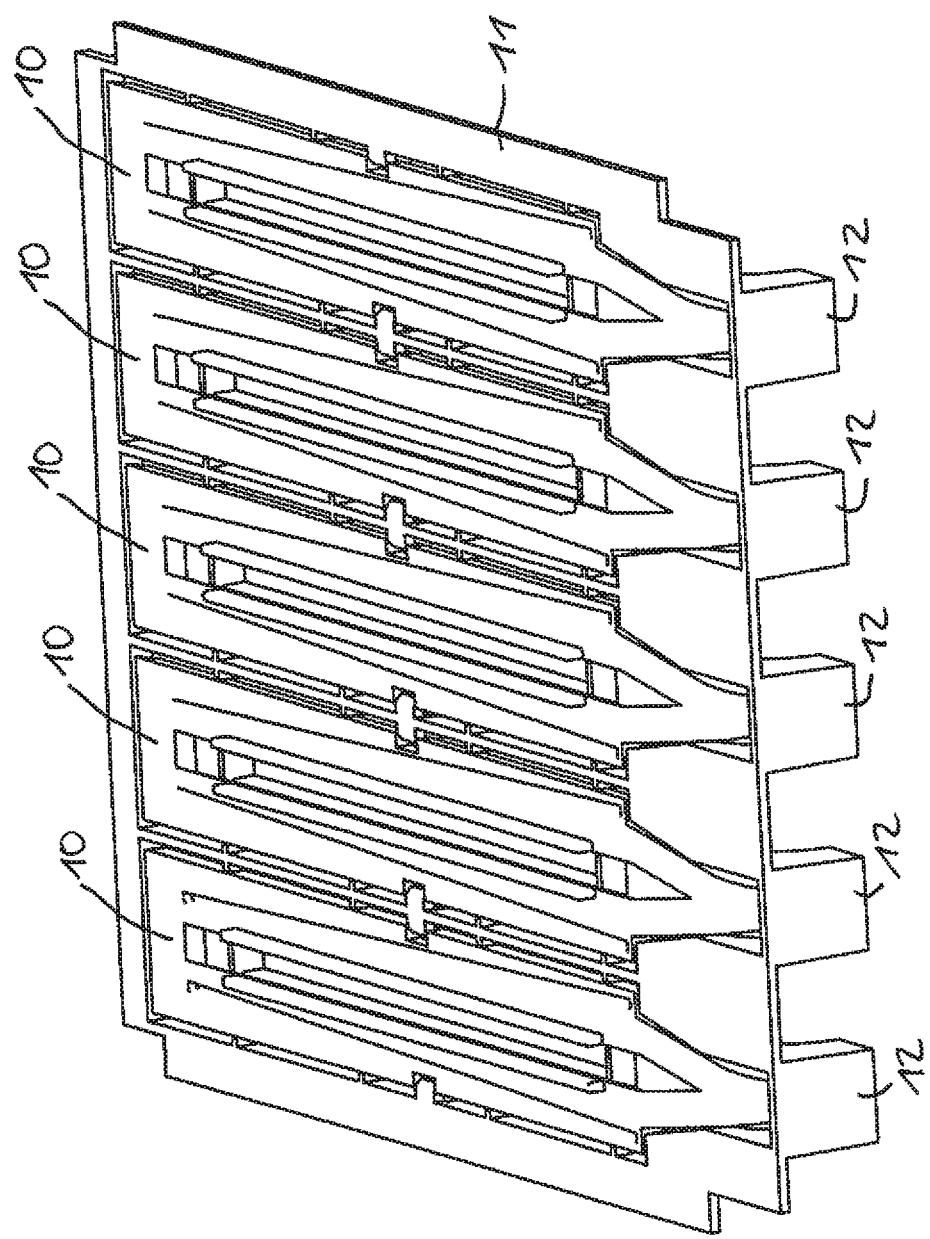
FIG. 2 illustrates five light conducting elements for illuminating five adjacent slits of slide controls of the lighting control console according to FIG. 1 in a perspective view from the top.

FIG. 2 illustrates five light conducting elements 10 which are all fixed on the inner side of the housing 08 by means of a support element 11 so as to illuminate five adjacent slits 09. The support element 11 comprises five sockets 12 on its bottom side, a light source, namely an LED light, being arranged in each socket 12 in order to couple the light required for illuminating the slits 09 into the light conducting elements 10.

FIG. 3 illustrates in a perspective view a light conducting element 10 from the bottom. The light conducting element 10 comprises a main light entry surface 13 at which the light generated by an LED light is coupled into the light conducting element 10. The light conducting element 10 is made of a light-conducting plastic material and can conduct the light to the light exit elements which are realized in the manner of light exit prisms 14. The light then exits from the light conducting element 10 at the light exit prisms 14 and thus illuminates each side of the slit 09 from the inner side of the housing 08. It can be seen that the light exit prisms 14 are arranged in a plurality one behind the other along the slit 09 at the light conducting element 10. In order to compensate the luminosity decreasing within the light conducting element 10 as the distance to the main light entry surface 13 increases, the individual light exit prisms 14 increase in size as the distance to the main light entry surface 13 increases so that as a result approximately the same amount of light exits from each individual light exit prism and a largely even illumination of the slits 09 is realized in this manner.

In order to be able to illuminate both sides of the slits 09 using a light conducting element 10, the light conducting element 10 diverges into two separate light conducting branches 15 starting from the main light entry surface. In order to be able to dispose the light sources within the sockets 12, the light conducting element 10 comprises an arch 16, in which the light is deflected by approximately 90°, between the main light entry surface 13 and the light conducting branches 15 which extend along the slit 09.

FIG. 4 illustrates the light conducting element 10 in an enlarged partial view. It can be seen that the individual light exit prisms 14 become larger the farther they are disposed from the main light entry surface 13. Owing to this change in size, the decreasing luminosity is compensated within the light conducting element 10 and the slits 09 are illuminated along the entire length of the slits 09 with a largely even luminosity.

The invention claimed is:

1. A lighting control console for controlling a lighting system, digital adjusting commands being generated in the lighting control console, said adjusting commands being able to be transmitted to the lighting devices of the lighting system via data links, and said lighting control console comprising at least one digital processor and at least one digital memory for generating, managing and storing the adjusting commands, and said lighting control console comprising at least one display device, and graphic elements being able to be graphically depicted for users at the display device, and at least one control knob being provided in the control panel of the lighting control console, input values being able to be input by the user by linearly adjusting the control knob, and a slide control being provided in the housing of the lighting control console, and a slit being provided in the housing of the lighting control console, being penetrated by a connecting lever originating from the interior of the housing and mechanically connecting the control knob to the slide control, wherein the following applies for the at least one slit in each case:

at least one light conducting element allocated to the slit is provided in the housing of the lighting control console and extends along the longitudinal axis of the slit, at least one light source is provided in the housing of the lighting control console, said light conducting element comprising at least one light entry surface at which light can be coupled into the light conducting element from the light source, and said light conducting element comprising light exit surfaces along the longitudinal axis of the slit, light being able to exit from the light conducting element so as to illuminate the slit, wherein each light conducting element has a main light entry surface, the light from the light source being coupled into the light conducting element exclusively at the main light entry surface, the light conducting element diverges into two separate light conducting branches starting from the main light entry surface, the slit extends between the two light conducting branches, and the light conducting element has an arch, in which the light is deflected, between the main light entry surface and the two light conducting branches, and the light exit surfaces of the light conducting element being formed by several light exit elements and the size of the light exit elements and/or the distance between adjacent light exit elements corresponding to the distance to the main light entry surface.

2. The lighting control console according to claim 1, wherein the light exit elements are realized in the manner of light exit prisms.

3. The lighting control console according to claim 1 wherein adjacent light exit elements each present an equidistant distance when the size of the light exit elements corresponds to the distance to the main light entry surface, the size of the light exit elements linearly increasing as the distance to the main light entry surface increases.

4. The lighting control console according to claim 1 wherein the multiple light exist elements each present the same size when the distance between adjacent light exit elements corresponds to the distance to the main light entry surface, said distance linearly decreasing as the distance to the main light entry surface increases.

5. The lighting control console according to claim 1 wherein the light conducting element is made of a plastic material capable of conducting light.

6. The lighting control console according to claim 1 wherein the light source for illuminating the light conducting element is realized in the manner of an LED illumination means.

\* \* \* \* \*